US010008526B2

(12) United States Patent
Park et al.

(10) Patent No.: US 10,008,526 B2
(45) Date of Patent: Jun. 26, 2018

(54) IMAGE SENSOR AND METHOD FOR FABRICATING THE SAME

(71) Applicant: SK hynix Inc., Gyeonggi-do (KR)

(72) Inventors: Sung-Kun Park, Gyeonggi-do (KR);
Yun-Hui Yang, Gyeonggi-do (KR);
Pyong-Su Kwag, Gyeonggi-do (KR);
Dong-Hyun Woo, Gyeonggi-do (KR);
Young-Jun Kwon, Gyeonggi-do (KR);
Min-Ki Na, Gyeonggi-do (KR);
Cha-Young Lee, Gyeonggi-do (KR);
Ho-Ryeong Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 10 days.

(21) Appl. No.: 15/238,468

(22) Filed: Aug. 16, 2016

(65) Prior Publication Data

US 2017/0294468 A1    Oct. 12, 2017

(30) Foreign Application Priority Data

Apr. 8, 2016  (KR) .......................... 10-2016-0043261

(51) Int. Cl.
*H01L 29/04* (2006.01)
*H01L 27/146* (2006.01)

(52) U.S. Cl.
CPC .... *H01L 27/14616* (2013.01); *H01L 27/1463* (2013.01); *H01L 27/14614* (2013.01); *H01L 27/14643* (2013.01); *H01L 27/14689* (2013.01)

(58) Field of Classification Search
CPC .............. H01L 27/14665–27/14676; H01L 27/14603–27/14616; H01L 27/1463; H01L 27/14689; H01L 27/14636
See application file for complete search history.

(56) References Cited

U.S. PATENT DOCUMENTS

| 8,471,313 | B2 | 6/2013 | Takahashi | |
|---|---|---|---|---|
| 8,531,567 | B2* | 9/2013 | Roy | H01L 27/14603 348/296 |
| 9,520,427 | B1* | 12/2016 | Yoo | H01L 27/14614 |
| 2012/0086845 | A1* | 4/2012 | Enomoto | H01L 27/14614 348/311 |
| 2012/0199882 | A1* | 8/2012 | Shin | H01L 27/14607 257/222 |
| 2014/0211056 | A1 | 7/2014 | Fan | |
| 2014/0347538 | A1* | 11/2014 | Toda | H01L 27/14603 348/308 |

(Continued)

FOREIGN PATENT DOCUMENTS

KR    1020170033465    3/2017

*Primary Examiner* — Kevin M Picardat
(74) *Attorney, Agent, or Firm* — IP & T Group LLP

(57) ABSTRACT

An image sensor may include: a photoelectric conversion element suitable for generating a photo charge in response to incident light; and a transfer transistor suitable for transferring the photo charge generated by the photoelectric conversion element to a floating diffusion in response to a transfer signal, the transfer transistor comprising a first transfer gate formed over the photoelectric conversion element; an opening formed in the first transfer gate and exposing the photoelectric conversion element; a second transfer gate formed in the opening; and a channel layer interposed between the first and second transfer gates and between the photoelectric conversion element and the second transfer gate.

24 Claims, 14 Drawing Sheets

(56) References Cited

U.S. PATENT DOCUMENTS

| | | |
|---|---|---|
| 2015/0029374 A1 | 1/2015 | Kitano |
| 2015/0243700 A1* | 8/2015 | Morooka .......... H01L 27/14643 |
| | | 257/292 |
| 2015/0243763 A1* | 8/2015 | Cheng ............... H01L 27/14614 |
| | | 438/270 |
| 2016/0020236 A1* | 1/2016 | Tanaka .............. H01L 27/14614 |
| | | 257/233 |
| 2016/0020237 A1* | 1/2016 | Yamakawa ............ H04N 5/374 |
| | | 257/233 |
| 2016/0343751 A1* | 11/2016 | Sze .................... H01L 27/1464 |
| 2017/0338264 A1* | 11/2017 | Kwag ............... H01L 27/14614 |

* cited by examiner

IMAGE SENSOR AND METHOD FOR FABRICATING THE SAME

CROSS-REFERENCE TO RELATED APPLICATIONS

The present application claims priority under 35 U.S.C. § 119(a) to Korean Patent Application No. 10-2016-0043261, filed on Apr. 8, 2016, which is incorporated herein by reference in its entirety.

BACKGROUND

Exemplary embodiments of the present invention relate generally to a technology for fabricating a semiconductor device and, more particularly, to an image sensor and a method for fabricating the same.

An image sensor converts an optical image into an electrical signal. Recently, due to the development of the computer industry and the communication industry, demand for an image sensor with improved performance has increased for various devices, such as digital cameras, camcorders, PCS (Personal Communication System), game machines, security cameras, medical micro-cameras, and robots.

SUMMARY

Various embodiments are directed to an enhanced image sensor and a method for fabricating the same.

In an embodiment, an image sensor may include: a photoelectric conversion element suitable for generating a photo charge in response to incident light; and a transfer transistor suitable for transferring the photo charge generated by the photoelectric conversion element to a floating diffusion in response to a transfer signal, the transfer transistor comprising a first transfer gate formed over the photoelectric conversion element; an opening formed in the first transfer gate and exposing the photoelectric conversion element; a second transfer gate formed in the opening; and a channel layer interposed between the first and second transfer gates and between the photoelectric conversion element and the second transfer gate.

The transfer transistor may further include a floating diffusion layer formed over the first transfer gate. The opening may expose the photoelectric conversion element through the first transfer gate and the floating diffusion layer. The channel layer may be formed along the resultant structure including the opening to contact the floating diffusion layer and the photoelectric conversion element. The floating diffusion layer may have a smaller area than the first transfer gate.

A transfer gate may include the first and second transfer gates overlaps the photoelectric conversion element in a vertical direction, and may have a larger area than the photoelectric conversion element. The first transfer gate may include a first gate electrode and a first gate dielectric layer surrounding the first gate electrode. The first gate dielectric layer may include a top dielectric layer formed on the top surface of the first gate electrode; a bottom dielectric layer formed between the bottom surface of the first gate electrode and the photoelectric conversion element; and a sidewall dielectric layer formed on the sidewalls of the first gate electrode including the sidewalls of the opening. The top dielectric layer, the bottom dielectric layer and the sidewall dielectric layer may have the same thickness, or the sidewall dielectric layer may have a smaller thickness than the top dielectric layer and the bottom dielectric layer. The opening may be positioned at the center or edge of the first transfer gate. The opening may have a pillar structure of which the plane shape corresponds to a polygonal, circular or elliptical shape or a part of a polygonal, circular or elliptical shape, the polygonal shape having a number of sides which is equal to or greater than that of a triangle. The channel layer interposed between the first and second transfer gates has a plane shape may include a ring shape with a polygonal, circular or elliptical shape, a straight line shape, a line shape with one or more vertexes or a line shape with a curvature, the polygonal shape having a number of sides which is equal to or greater than that of a triangle. One end of the channel layer may be expanded to the bottom surface of the opening to contact the photoelectric conversion element, and the other end of the channel layer may be expanded to the top of the first transfer gate, and wherein the channel layer expanded to the top of the first transfer gate serves as the floating diffusion. The channel layer may include undoped polysilicon or P-type polysilicon. While the transfer transistor is turned off, a negative voltage may be applied to the first and second transfer gates. The channel layer may include N-type polysilicon.

In an embodiment, a method for fabricating an image sensor may include: forming a multilayer over a substrate including a photoelectric conversion element, the multilayer having a structure in which a first dielectric layer, a first conductive layer and a second dielectric layer are sequentially stacked; selectively etching the multilayer so as to form an opening which exposes the photoelectric conversion element, and forming a pattern over the photoelectric conversion element, the pattern having a structure in which a bottom dielectric layer, a first gate electrode and a top dielectric layer are sequentially stacked; forming a first transfer gate over the photoelectric conversion element by forming a sidewall dielectric layer on the sidewalls of the pattern including the sidewalls of the opening, the first transfer gate including the first gate electrode, the bottom dielectric layer, the top dielectric layer and the sidewall dielectric layer; forming a channel layer along the surface of the resultant structure including the opening; and forming a second transfer gate on the channel layer, such that the second transfer gate fills the opening.

The forming of the multilayer may include forming a second conductive layer over the second dielectric layer. The method may further include forming a floating diffusion layer having a smaller area than the first transfer gate by selectively etching the second conductive layer, after the forming of the second transfer gate.

The channel layer may be connected to the floating diffusion layer and the photoelectric conversion element. The top dielectric layer, the bottom dielectric layer and the sidewall dielectric layer may have the same thickness, or the sidewall dielectric layer may have a smaller thickness than the top dielectric layer and the bottom dielectric layer. The opening may be positioned at the center or edge of the first transfer gate. The opening may have a pillar structure of which the plane shape corresponds to a polygonal, circular or elliptical shape or a part of a polygonal, circular or elliptical shape, the polygonal shape having a number of sides which is equal to or greater than that of a triangle. The channel layer interposed between the first and second transfer gates may have a plane shape including a ring shape with a polygonal, circular or elliptical shape, a straight line shape, a line shape with one or more vertexes or a line shape with a curvature, the polygonal shape having a number of sides which is equal to or greater than that of a triangle.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
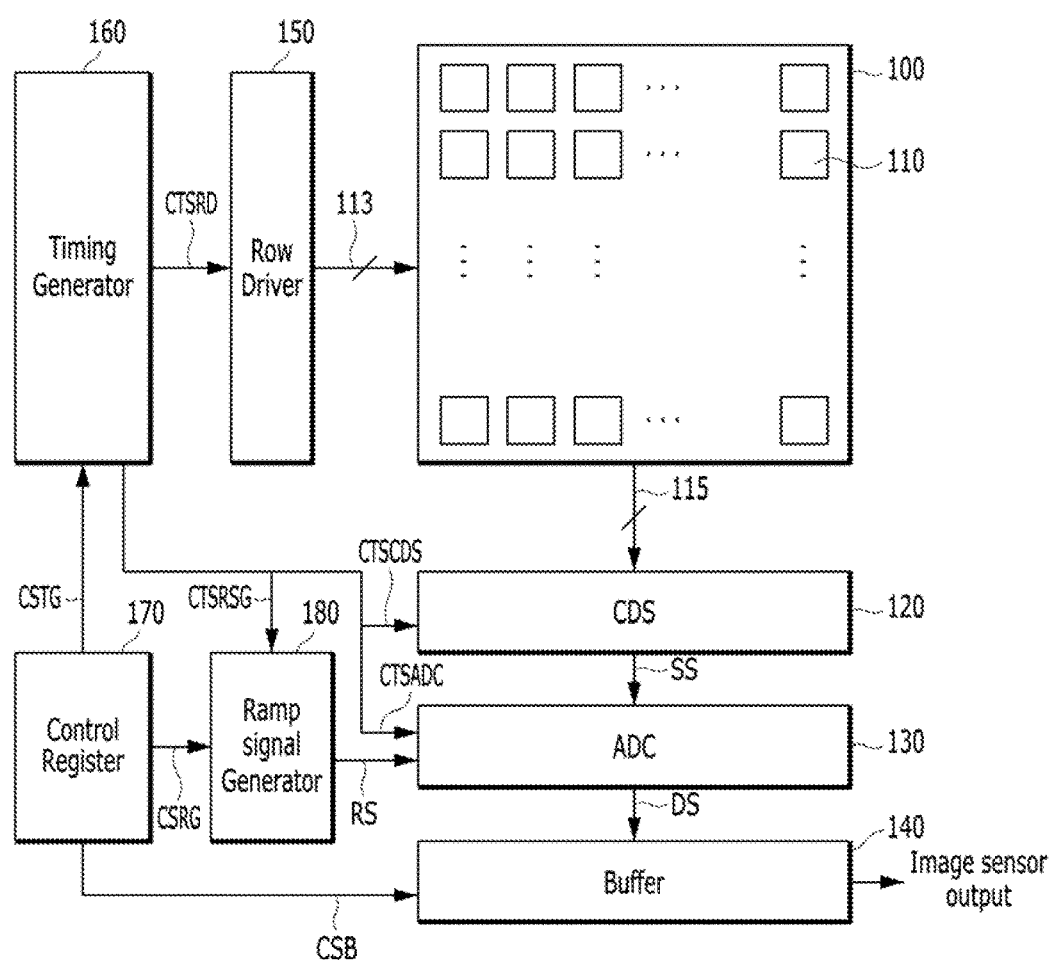
FIG. 1 is a block diagram schematically illustrating an image sensor, in accordance with an embodiment of the present invention.

Hereafter, various embodiments of the disclosed technology are described below in detail with reference to the accompanying drawings. The drawings may not be necessarily to scale and in some instances, proportions of at least some of structures in the drawings may have been exaggerated clearly illustrate certain features of the described embodiments. In presenting a specific example in a drawing or description having two or more layers in a multi-layer structure, the relative positioning relationship of such layers or the sequence of arranging the layers as shown reflects a particular embodiment for the described or illustrated example and a different relative positioning relationship or sequence of arranging the layers may be possible. In addition, a described or illustrated example of a multi-layer structure may not reflect all layers present in that particular multilayer structure for example, one or more additional layers may be present between two illustrated layers. As a specific example, when a first layer in a described or illustrated multi-layer structure is referred to as being "on" or "over" a second layer or "on" or "over" a substrate, the first layer may be directly formed on the second layer or the substrate but may also represent a structure in which one or more other intermediate layers may exist between the first layer and the second layer or the substrate.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated to more clearly illustrate the various elements of the embodiments. For example, in the drawings, the size of elements and the intervals between elements may be exaggerated compared to actual sizes and intervals for convenience of illustration.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature, described in connection with one embodiment may be used singly or in combination with other elements of another embodiment, unless specifically indicated otherwise.

Hereinafter, the following embodiments provide an enhanced image sensor capable of providing a high-pixel image and a method for fabricating the same. To provide a high-pixel image, an image sensor is required to have a large number of unit pixels integrated in a limited area. Each of the unit pixels included in an image sensor, in accordance with an embodiment of the present invention, may include a transfer transistor with a vertical channel and multi-transfer gates, and have a structure in which the transfer transistor and a photoelectric conversion element are stacked. Such configuration is advantageous because it reduces the footprint of each unit pixel.

FIG. 1 illustrates an image sensor in accordance with an embodiment of the present invention.

As illustrated in FIG. 1, the image sensor may include a pixel array 100, a correlated double sampler (CDS) 120, an analog-digital converter (ADC) 130, a buffer 140, a row driver 150, a timing generator 160, a control register 170, and a ramp signal generator 180. The pixel array 100 may include a plurality of unit pixels 110 arranged in a matrix.

The timing generator 160 may generate one or more control timing signals CTSRD, CTSCDS, CTSADC and CTSRSG for controlling the row driver 150, the CDS 120, the ADC 130, and the ramp signal generator 180, respectively. The control register 170 may generate one or more control signals CSRG, CSTG, and CSB for controlling the ramp signal generator 180, the timing generator 160, and the buffer 140, respectively.

The row driver 150 may drive the pixel array 100 row by row. For example, the row driver 150 may generate a select signal for selecting any one row line of a plurality of row lines 113. Each of the unit pixels 110 may sense incident light and output an image reset signal IRS and an image signal IS to the CDS 120 through a column line 115. The CDS 120 may perform sampling of the pixel output in response to the image reset signal and the image signal.

The ADC 130 may compare a ramp signal RS outputted from the ramp signal generator 180 with a sampling signal SS outputted from the CDS 120, and output a comparison signal to the buffer 140. According to a clock signal provided from the timing generator 160, the ADC 130 may count the level transition time of the comparison signal, and output the count value to the buffer 140. The ramp signal generator 180 may operate under control of the timing generator 160.

The buffer 140 may store a plurality of digital signals DS outputted from the ADC 130. The buffer 140 also may sense and amplify the digital signals DS. Thus, the buffer 140 may include a memory (not illustrated) and a sense amplifier (not illustrated). The memory may store count values. The count values may represent signals outputted from the plurality of unit pixels 110. The sense amplifier may sense and amplify the count values outputted from the memory.

To provide a high-pixel image, the number of unit pixels 110 integrated in the pixel array 100 needs to be increased. That is, a larger number of unit pixels 110 need to be arranged in a limited area. For this structure, the physical size of the unit pixel 110 needs to be reduced. However, the image sensor is operated based on a pixel signal generated through each of the unit pixels 110 in response to incident light. Thus, when the physical size of the unit pixel 110 is reduced, the number of photons incident on the unit pixel 110 decreases to inevitably degrade the characteristic of the unit pixel 110.

Therefore, the following embodiments are directed to an image sensor which is capable of facilitating high integration and preventing the characteristic degradation caused by the increase of integration density. The image sensor will be described in detail with reference to the accompanying drawings.

Figure 2:
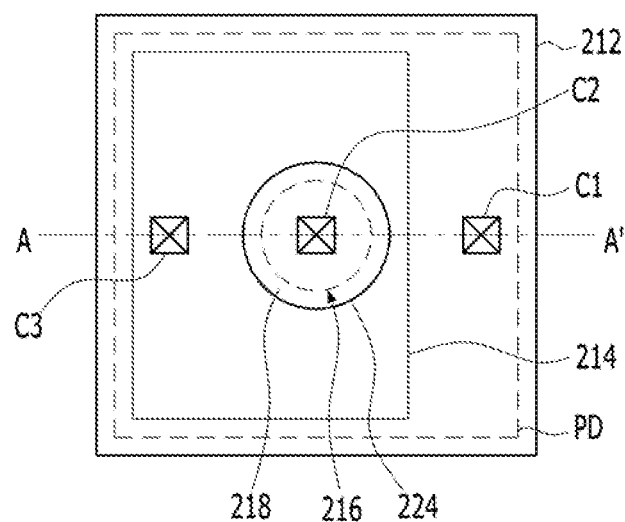
FIG. 2 is a plane view illustrating a unit pixel of an image sensor in accordance with an embodiment.
Figure 3:
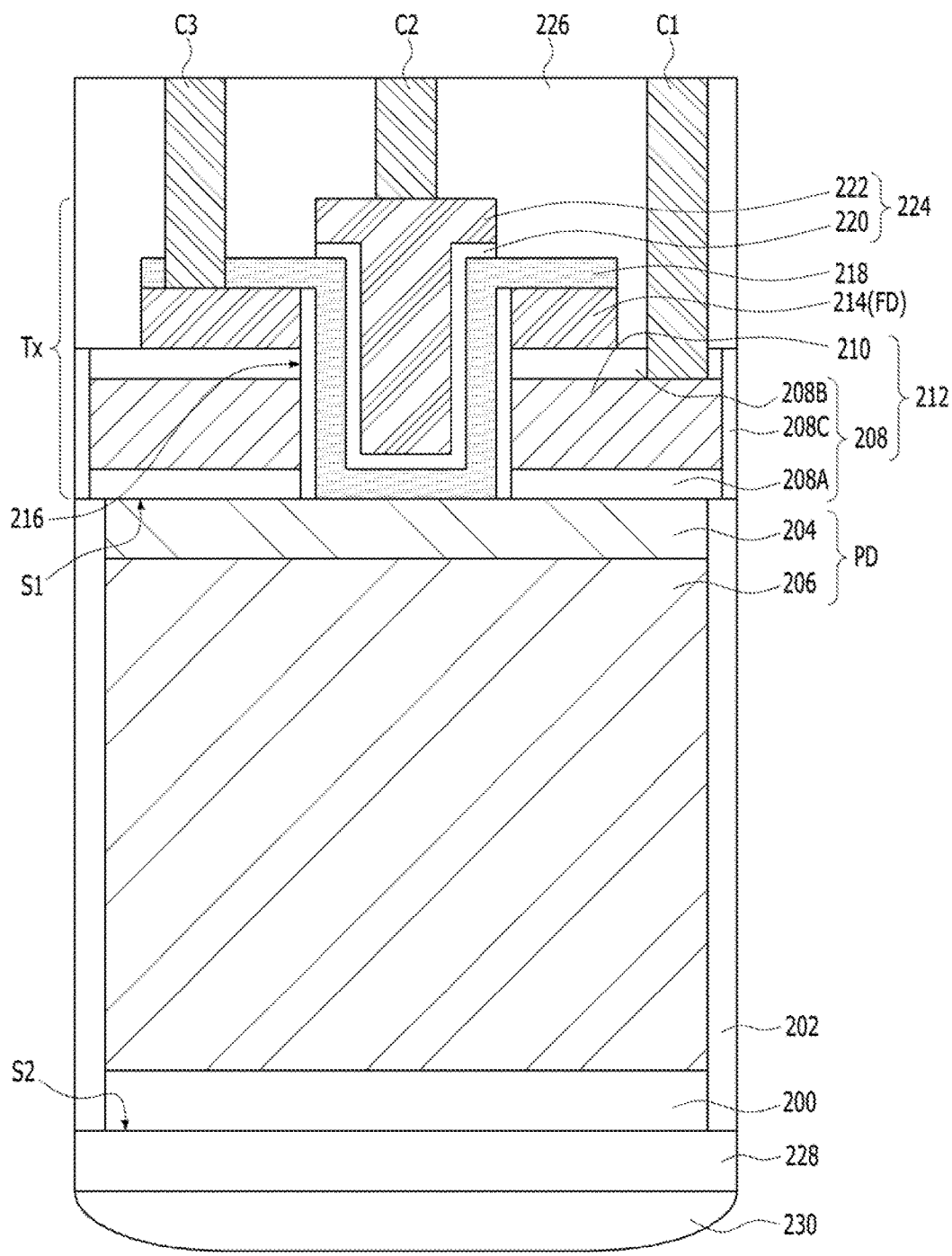
FIG. 3 is a cross-sectional view of the unit pixel of the image sensor in accordance with the embodiment, taken along line A-A' of FIG. 2.

FIG. 2 is a plane view illustrating a unit pixel of an image sensor in accordance with an embodiment. FIG. 3 is a cross-sectional view of the unit pixel of the image sensor in accordance with the embodiment, taken along line A-A' of FIG. 2.

As illustrated in FIGS. 2 and 3, each of the unit pixels in the image sensor, in accordance with an embodiment of the present invention, may include a photoelectric conversion element PD and a transfer transistor Tx. The photoelectric conversion element PD may generate a photo charge in response to incident light. The transfer transistor Tx may transfer the generated photo charge to a floating diffusion FD in response to a transfer signal. Specifically, each of the unit pixels in the image sensor may include a substrate 200, a first transfer gate 212, a floating diffusion layer 214, an opening 216, a second transfer gate 224 and a channel layer 218. The substrate 200 may include a photoelectric conversion element PD and an isolation structure 202 for isolating adjacent photoelectric conversion elements PD from each other. The first transfer gate 212 may be formed over the photoelectric conversion element PD, and the floating diffusion layer 214 may be formed over the first transfer gate 212. The opening 216 may be formed in the first transfer gate 212 and the floating diffusion layer 214 to partially expose the photoelectric conversion element PD. Then, the second transfer gate 224 may be formed in the opening 216 to have a generally T shape, and the channel layer 218 may be interposed between the first and second transfer gates 212 and 224, between the second transfer gate and the photoelectric conversion element PD, and also extend over the floating diffusion layer 214. Hence, the channel layer 218 when viewed in a side cross-sectional view as in FIG. 3, has a composite shape including a generally U shape with a flat base that conforms to the outer surface of the vertical member of the T shape $2^{nd}$ transition gate. The vertical legs of the U shape of the channel layer 218 connect at their uppermost point with a horizontal flat part of the channel layer 218 that extends over the floating diffusion layer 214.

The floating diffusion layer 214 and the flat part of the channel layer are coextensive and do not contact a first contact C1.

The flat base of the U shape of the channel layer is adjacent a central part of a first surface of the photodiode PD that would otherwise have been exposed to the opening 216.

Furthermore, each of the unit pixels may include an interlayer dielectric layer 226, first to third contacts C1 to C3, a color separation element 228 and a light focusing element 230. The interlayer dielectric layer 226 may cover the entire surface of the resultant structure including the first and second transfer gates 212 and 214. The first to third contacts C1 to C3 may be elongated vertically disposed elements and may be connected to the first transfer gate 212, the second transfer gate 224 and the floating diffusion layer 214, respectively, through the interlayer dielectric layer 226. The color separation element 228 may be formed over the substrate 200, and the light focusing element 230 may be formed over the color separation element 228.

Hereafter, the respective components will be described in more detail.

Each of the unit pixels in the image sensor in accordance with the present embodiment may include the photoelectric conversion element PD formed in the substrate 200 and the isolation structure 202 formed in the substrate 200 to isolate the adjacent photoelectric conversion elements PD from each other.

The substrate 200 may include a semiconductor substrate. The semiconductor substrate may have a single crystal state and include a silicon containing material. That is, the substrate 200 may include a single-crystal silicon containing material. The substrate 200 may include a substrate thinned through a thinning process. For example, the substrate 200 may include a bulk silicon substrate thinned through a thinning process.

The isolation structure 202 may include an STI (Shallow Trench Isolation), DTI (Deep Trench Isolation) or impurity region. The impurity region may be formed by implanting an impurity into the substrate 200. For example, the impurity region may include a P-type impurity region formed by implanting a P-type impurity, for example, boron (B) into the substrate 200. The isolation structure 202 may include any one of STI, DTI and impurity regions or combinations of two or more thereof. For example, the isolation structure 202 which surrounds the photoelectric conversion element PD may include the DTI region or a combination of the DTI region and the impurity region.

The photoelectric conversion element PD may include an organic or inorganic photodiode. For example, the photoelectric conversion element PD may be formed in the substrate 200, and have a structure in which first and second impurity regions 204 and 206 having complementary conductivity types with each other are stacked in the vertical direction. The first impurity region 204 may contact the first transfer gate 212 and the channel layer 218. The first impurity region 204 may be a P-type impurity region, and the second impurity region 206 may be an N-type impurity region.

Each of the unit pixels in the image sensor in accordance with the present embodiment may include the first transfer gate 212 formed over the photoelectric conversion element PD, the floating diffusion layer 214 formed over the first transfer gate 212, and a centrally disposed opening 216 extending through the first transfer gate 212 and the floating diffusion layer 214 to expose a central part of the photoelectric conversion element PD.

The first transfer gate 212 may be formed on a first surface S1 of the substrate 200 having the photoelectric conversion element PD formed therein, and vertically overlap the photoelectric conversion element PD. Since the first transfer gate 212 is formed on an incident surface through which incident light is introduced to the photoelectric conversion element PD, that is, the first surface S1 facing a second surface S2 of the substrate 200, the first transfer gate 212 may serve as a back reflecting layer for incident light having passed through the photoelectric conversion element PD, thereby increasing the quantum efficiency of the photoelectric conversion element PD. Furthermore, since the first transfer gate 212 vertically overlaps the photoelectric conversion element PD, the first transfer gate 212 increases the fill factor of the photoelectric conversion element PD, and also improves the integration density of the unit pixel.

The first transfer gate 212 may be formed in a plate shape, and the outer vertical wall of the first transfer gate 212 may be set at a more outer position than the outer vertical wall of the photoelectric conversion element PD. That is, the transfer gate 212 including the opening 216 may have a larger area than the photoelectric conversion element PD. This may be advantageous, since a bias applied to the first transfer gate 212 may be controlled to prevent the occurrence of dark current due to a defect on the first surface S1 of the substrate 200, which overlaps the first transfer gate 212. For example, when a negative voltage such as an Negative Charge Pump (NCP) voltage is applied to the first transfer gate 212 in a state where the transfer transistor Tx is turned off, the occurrence of dark current due to a defect on the first surface S1 of the substrate 200 can be prevented.

The first transfer gate 212 may include a first gate electrode 210 and a first gate dielectric layer 208 surrounding the first gate electrode 210. The first gate dielectric layer 208 may seal the first gate electrode 210. Specifically, the first gate dielectric layer 208 may serve to electrically separate the first gate electrode 210 from the photoelectric conversion element PD, electrically separate the first gate electrode 210 from the floating diffusion layer 214, and electrically separate the first gate electrode 210 from the channel layer 218. For this operation, the first gate dielectric layer 208 may include a bottom dielectric layer 208A, a top dielectric layer 208B and a sidewall dielectric layer 208C. The bottom dielectric layer 208A may be formed under the first gate electrode 210 or interposed between the first gate electrode 210 and the photoelectric conversion element PD. The top dielectric layer 208B may be formed over the first gate electrode 210 or interposed between the first gate electrode 210 and the floating diffusion layer 214. The sidewall dielectric layer 208C may be formed on a sidewall of the first gate electrode 210, and a part of the sidewall dielectric layer 208C may be expanded to a sidewall of the floating diffusion layer 214. The bottom dielectric layer 208A, the top dielectric layer 208B and the sidewall dielectric layer 208C in the first gate dielectric layer 208 may have the same or different thicknesses. For example, to improve the gate control power of the first transfer gate 212 while reducing parasitic capacitance between the structures adjacent to the first transfer gate 212, the bottom dielectric layer 208A and the top dielectric layer 208B may have a larger thickness than the sidewall dielectric layer 208C. Each of the bottom dielectric layer 208A, the top dielectric layer 208B and the sidewall dielectric layer 208C in the first gate dielectric layer 208 may include at least one compound selected from the group consisting of oxides, nitrides and oxynitrides.

The floating diffusion layer 214 formed over the first transfer gate 212 may vertically overlap the photoelectric conversion element PD and the first transfer gate 212, and have a plate shape. The floating diffusion layer 214 may have a smaller area than the first transfer gate 212, to provide a space in which the first contact C1 connected to the first transfer gate 212 is formed. The floating diffusion layer 214 may include a conductive layer, and the conductive layer may include a semiconductor material or metallic material. For example, the floating diffusion layer 214 may include a silicon containing material. The silicon containing material may include single crystal silicon or polysilicon. The single crystal silicon or polysilicon may be doped with an N-type impurity.

The opening 216 may penetrate through the floating diffusion layer 214 and the first transfer gate 212 to expose the first impurity region 204 of the photoelectric conversion element PD. The opening 216 may provide a space in which the channel layer 218 and the second transfer gate 224 are to be formed. As illustrated in FIG. 3, the opening 216 may be positioned in the center of the photoelectric conversion element PD or the first transfer gate 212, and formed in a cylindrical shape with a circular plane shape. However, the position, number, and plane shape of the opening 216 may not be limited to the above-described embodiment, but modified in various manners. The position, number, and plane shape of the opening 216 will be described later with reference to FIGS. 4A to 4H.

Each of the unit pixels in the image sensor in accordance with the present embodiment may include the second transfer gate 224 formed in the opening 216 and the channel layer 218 interposed between the first and second transfer gates 212 and 224. For reference, the channel layer 218 interposed between the first and second transfer gates 212 and 224 may be formed on the sidewalls of the opening 216, and have both ends contacting the photoelectric conversion element PD and the floating diffusion layer 214, respectively.

The second transfer gate 224 may fill the opening 216. The transfer gate including the first and second transfer gates 212 and 224 may have a larger area than the photoelectric conversion element PD. The first and second transfer gates 212 and 224 may receive the same transfer signal through the first and second contacts C1 and C2, respectively, or receive different transfer signals. That is, the first and second transfer gates 212 and 224 may be operated at the same time in response to the same transfer signal or independently operated in response to different transfer signals. Like the first transfer gate 212, the second transfer gate 224 may prevent the occurrence of dark current due to a defect on the first surface S1 of the substrate 200 overlapping the second transfer gate 224. For example, when a negative voltage such as an NCP voltage is applied to the second transfer gate 224 in a state where the transfer transistor Tx is turned off, the occurrence of dark current due to a defect on the first surface S1 of the substrate 200 can be prevented.

The second transfer gate 224 may include a second gate dielectric layer 220 formed on the channel layer 218 and a second gate electrode 222 formed on the second gate dielectric layer 220. The second gate dielectric layer 220 may be formed along the surface of the resultant structure including the channel layer 218, and have a constant thickness along the surface of the resultant structure. The second gate dielectric layer 220 may include at least one compound selected from the group consisting of oxide, nitride and oxynitride. In the present embodiment, the second gate dielectric layer 220 is interposed only between the channel layer 218 and the second gate electrode 222. However, a part of the second gate dielectric layer 220 may be expanded onto the channel layer 218 formed over the floating diffusion layer 214. The second gate electrode 222 may be buried in the opening 216, and partially protrude over the opening 216. The second gate electrode 222 may include a semiconductor material or metallic material.

The channel layer 218 may be formed on the sidewalls of the opening 216. Both ends of the channel layer 218 may be connected to the photoelectric conversion element PD and the floating diffusion layer 214, respectively. Specifically, one end of the channel layer 218 may be expanded to the bottom surface of the opening 216, and connected to the photoelectric conversion element PD. The channel layer 218 expanded to the bottom surface of the opening 216 may be interposed between the photoelectric conversion element PD and the second transfer gate 224. The other end of the channel layer 218 may be expanded to the top of the floating diffusion layer 214, connected to the floating diffusion layer 214, and vertically overlap the floating diffusion layer 214. Thus, the channel layer 218 may be formed along the surface of the resultant structure including the opening 216.

The channel layer 218 may include a silicon containing material. For example, the channel layer 218 may include polysilicon. Specifically, the channel layer 218 may include any one of undoped polysilicon, P-type polysilicon doped with a P-type impurity and N-type polysilicon doped with an N-type impurity. When the channel layer 218 includes undoped polysilicon or P-type polysilicon, the transfer transistor Tx may be operated in an enhancement mode where the channel maintains an inactive state in an off state. On the other hand, when the channel layer 218 includes N-type polysilicon, the transfer transistor Tx may be operated in a depletion mode where the channel maintains an active state in an off state.

For reference, polysilicon has a plurality of trap sites. Thus, when polysilicon is applied as the channel layer 218, the trap sites in the channel layer 218 may serve as dark current sources. However, the image sensor in accordance with the present embodiment can prevent a dark current which may occur when polysilicon is applied as the channel layer 218. Specifically, when the channel layer 218 includes undoped polysilicon or P-type polysilicon and a negative voltage is applied to the first and second transfer gates 212 and 224 in a state where the transfer transistor Tx is turned off, for example, during an integration time, holes may be accumulated in the channel layer 218 and the interface between the photoelectric conversion element PD and the channel layer 218, thereby preventing the occurrence of dark current. At this time, although a dark current is generated, the generated dark current can be eliminated through recombination of the holes accumulated in the interface.

However, when the channel layer 218 includes N-type polysilicon, the transfer transistor Tx may operate in the depletion mode. Thus, while the transfer transistor Tx is turned off, for example, during the integration time, the dark current generated in the channel layer 218 and the interface between the photoelectric conversion element PD and the channel layer 218 can be discharged to the outside through the floating diffusion layer 214 and the third contact C3. At this time, when the channel layer 218 includes N-type polysilicon, the dark current generated in the channel layer 218 can be discharged to the outside. Thus, it is possible to more effectively prevent the occurrence of dark current than when the channel layer 218 includes undoped polysilicon or P-type polysilicon.

Each of the unit pixels in accordance with the present embodiment may include the interlayer dielectric layer 226 covering the entire surface of the resultant structure including the first and second transfer gates 212 and 214, the first to third contacts C1 to C3 connected to the first transfer gate 212, the second transfer gate 224 and the floating diffusion layer 214, respectively, through the interlayer dielectric layer 226, the color separation element 228 formed over the second surface S2 of the substrate 200, and the light focusing element 230 formed over the color separation element 228.

The interlayer dielectric layer 226 may be formed on the first surface S1 of the substrate 200, and include at least one compound selected from the group consisting of oxide, nitride and oxynitride. In the present embodiment, one first contact C1, one second contact C2 and one third contact C2 may be provided. However, a plurality of first contacts C1, a plurality of second contacts C2 and a plurality of third contacts C3 may be provided.

The color separation element 228 may include a color filter. The color filter may include a red filter, a green filter, a blue filter, a cyan filter, a yellow filter, a magenta filter, a white filter, a black filter and an IR cutoff filter. The light focusing element 230 may include a digital lens or hemispherical lens.

In the present embodiment, one pillar-shaped opening 216 having a circular plane shape may be arranged in the center of the first transfer gate 212 and the photoelectric conversion element PD, and the channel layer 218 interposed between the first and second transfer gates 212 and 224 may have a ring shape. Hereafter, referring to FIGS. 4A to 4H, the position, shape and number of the opening 216 and the shape of the channel layer 218 interposed between the first and second transfer gates 212 and 224 will be described with reference to various modifications.

Figure 4A:
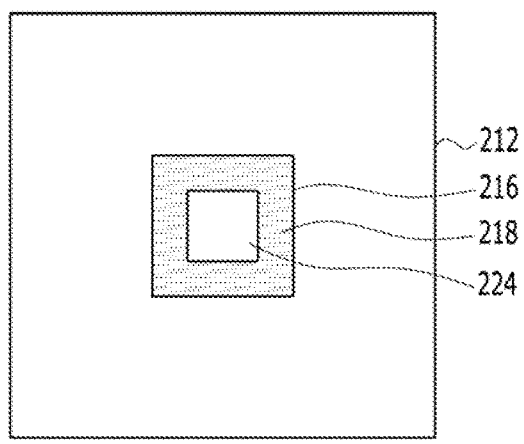
FIGS. 4A and 4H are plane views illustrating the unit pixel of the image sensor in accordance with an embodiment of the present invention.
Figure 4B:
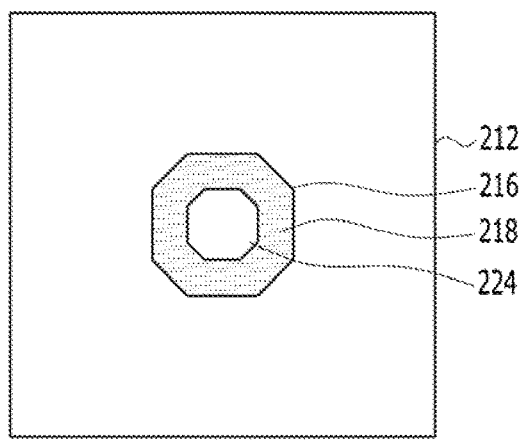
Figure 4C:
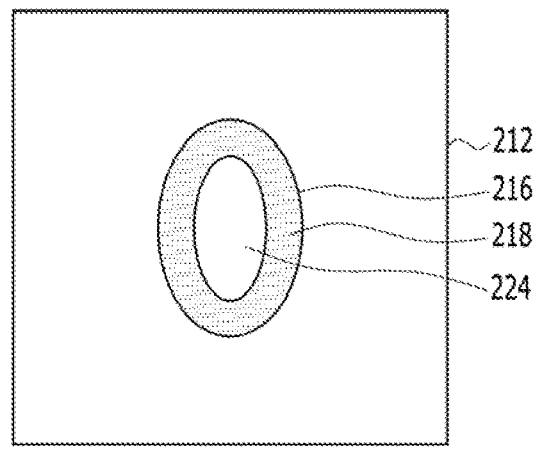
Figure 4D:
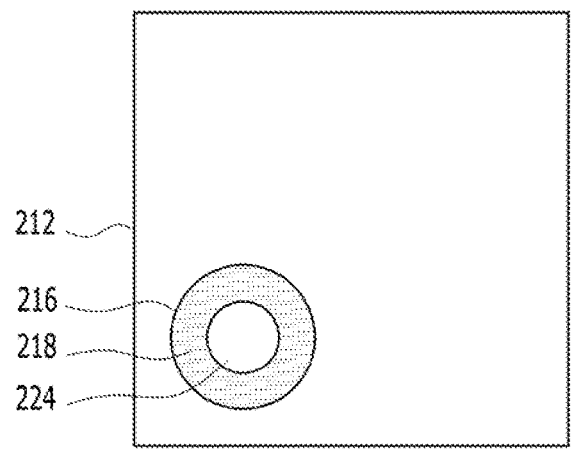
Figure 4E:
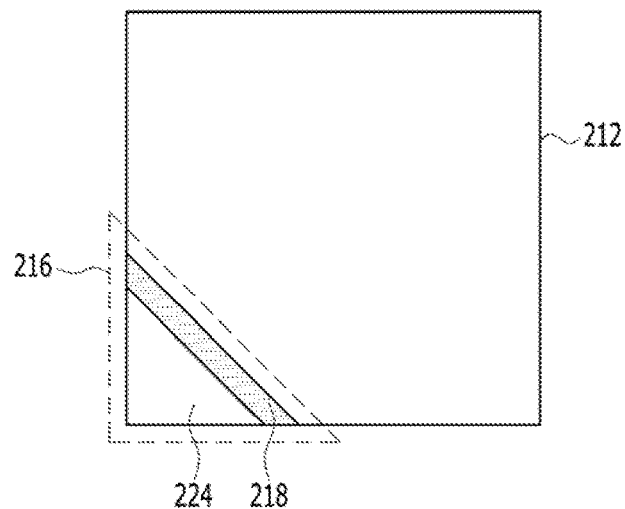
Figure 4F:
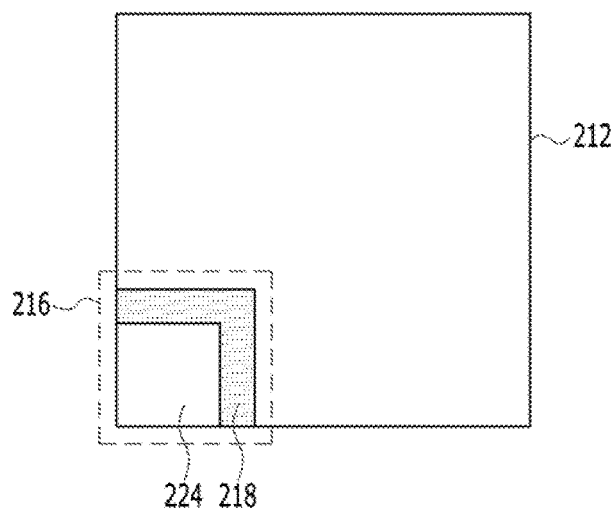
Figure 4G:
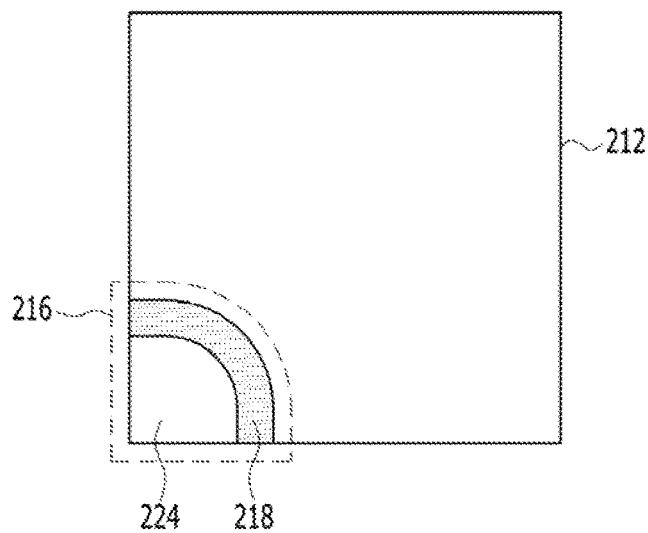
Figure 4H:
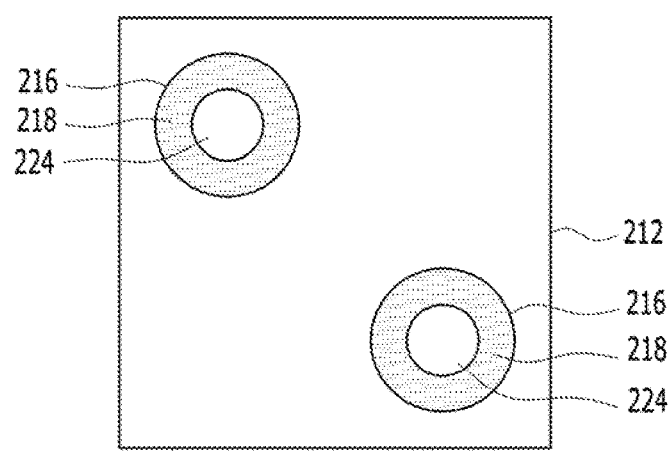

FIGS. 4A and 4H are plane views illustrating the unit pixel of the image sensor in accordance with the embodiment of the present invention. For convenience of description, FIGS. 4A to 4H briefly illustrate only the first transfer gate 212, the second transfer gate 224, the opening 216 and the channel layer 218 interposed between the first and second transfer gates 212 and 224.

First, as illustrated in FIGS. 4A to 4C, the opening 216 may be positioned at the center of the first transfer gate 212, and have a pillar structure of which the plane shape corresponds to a polygonal, circular or elliptical shape. The polygonal shape may have a number of sides which is equal to or larger than a triangle. Specifically, the pillar structure may have a rectangular plane shape (refer to FIG. 4A), an octagonal plane shape (refer to FIG. 4B) or an elliptical shape (refer to FIG. 4C). The channel layer 218 interposed between the first and second transfer gates 212 and 224 may have a ring shape.

As illustrated in FIG. 4D, the opening 216 may be positioned at an edge of the first transfer gate 212. At this time, the edge may include a vertex of the first transfer gate 212. At this time, the opening 216 may have a pillar structure of which the plane shape corresponds to a polygonal, circular or elliptical shape. The polygonal shape may have a number of sides which is equal to or larger than a triangle. The channel layer 218 interposed between the first and second transfer gates 212 and 224 may have a ring shape.

As illustrated in FIGS. 4E to 4G, the opening 216 may be positioned at an edge or vertex of the first transfer gate 212, and have a pillar structure of which the plane shape corresponds to a part of a polygonal, circular or elliptical shape. The channel layer 218 interposed between the first and second transfer gates 212 and 224 may have a straight line shape, a line shape with one or more vertexes or a line shape with a curvature.

Specifically, referring to FIGS. 4E and 4F, the opening 216 may have a pillar structure of which the plane shape corresponds to a part of a shape obtained by dividing a rectangle by four, that is, a triangular shape or rectangular shape corresponding to ¼ of a rectangle. The channel layer 218 interposed between the first and second transfer gates 212 and 224 may have a straight line shape (refer to FIG. 4E) or a line shape with one or more vertexes (refer to FIG. 4F).

Referring to FIG. 4G, the opening 216 may have a pillar structure of which the plane shape corresponds to a part of a shape obtained by dividing a circle by four, that is, a fan shape corresponding to ¼ of a circle. At this time, the channel layer 218 interposed between the first and second transfer gates 212 and 224 may have a line shape with a curvature.

As illustrated in FIG. 4H, the first transfer gate 212 may include one or more openings 216. That is, each of the unit pixels may include a plurality of openings 216, and each of the openings 216 may include a second transfer gate 224 and a channel layer 218 which are formed therein.

As described above, the position, shape and number of the opening 216 and the shape of the channel layer 218 interposed between the first and second transfer gates 212 and 224 in the image sensor in accordance with present embodiment may be modified in various manners, and the above-described modifications can be combined.

Hereafter, a method for fabricating an image sensor in accordance with an embodiment of the present invention will be described with reference to FIGS. 5A to 5E. FIGS. 5A to 5E are cross-sectional views illustrating a method for fabricating an image sensor in accordance with an embodiment of the present invention, taken along line A-A' of FIG. 2.

Figure 5A:
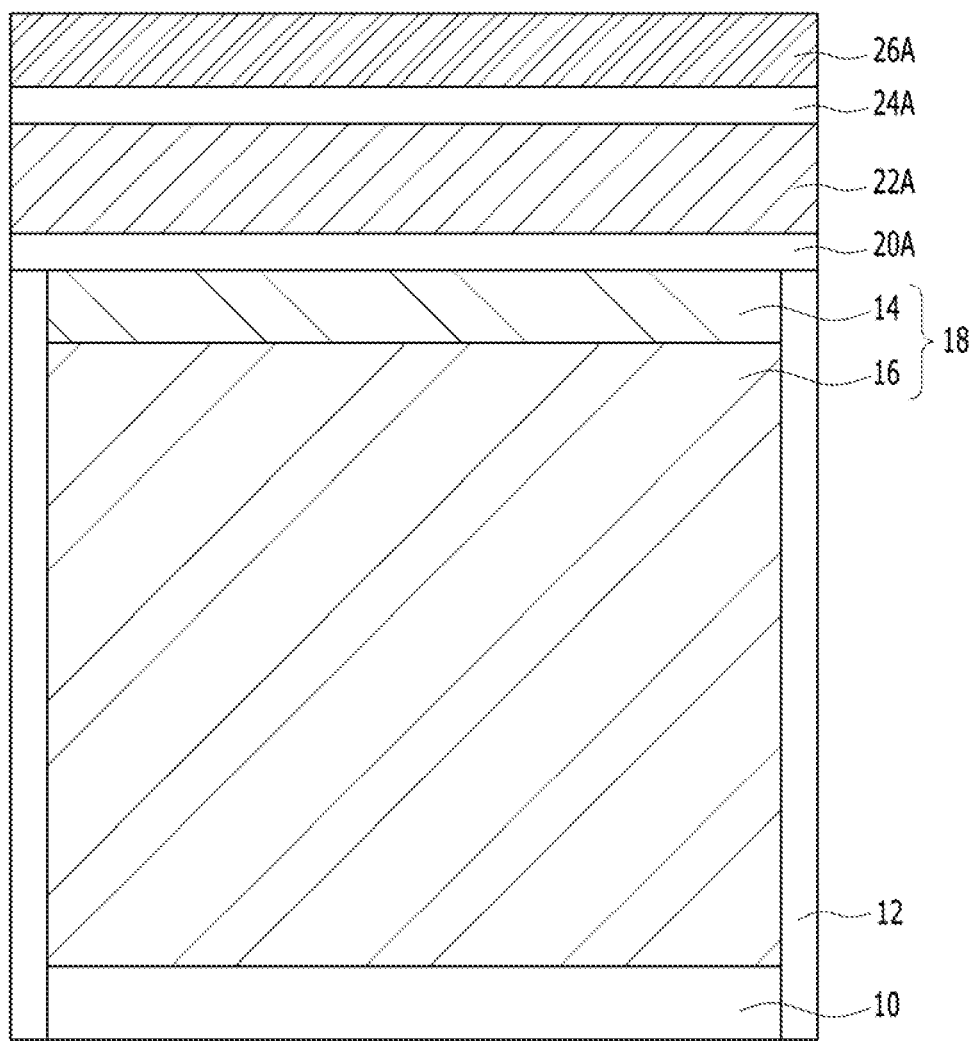
FIGS. 5A to 5E are cross-sectional views illustrating a method for fabricating an image sensor in accordance with an embodiment of the present invention, taken along line A-A' of FIG. 2.

As illustrated in FIG. 5A, a photoelectric conversion element 18 and an isolation structure 12 may be formed in a substrate 10, the isolation structure 12 isolating adjacent photoelectric conversion elements 18 from each other. The substrate 10 may include a single-crystal silicon containing material. The isolation structure 12 may include an STI, DTI or impurity region. The isolation structure 12 may include any one of STI, DTI and impurity regions or combinations of two or more thereof. The photoelectric conversion element may include a photodiode. Specifically, the photoelectric conversion element 18 may have a structure in which a first impurity region 14 and a second impurity region 16 are vertically stacked. The first impurity region 14 may be formed by implanting a P-type impurity such as B into the substrate 10, and the second impurity region 16 may be formed by implanting an N-type impurity such as phosphorous (P) or arsenic (As) into the substrate 10.

Then, a multilayer may be formed, in which a first dielectric layer 20A, a first conductive layer 22A, a second dielectric layer 24A and a second conductive layer 26A are sequentially stacked. The first and second dielectric layers 20A and 24A may include at least one compound selected from the group consisting of oxide, nitride and oxynitride. The first and second conductive layers 22A and 26A may include a semiconductor material or metallic material.

Figure 5B:
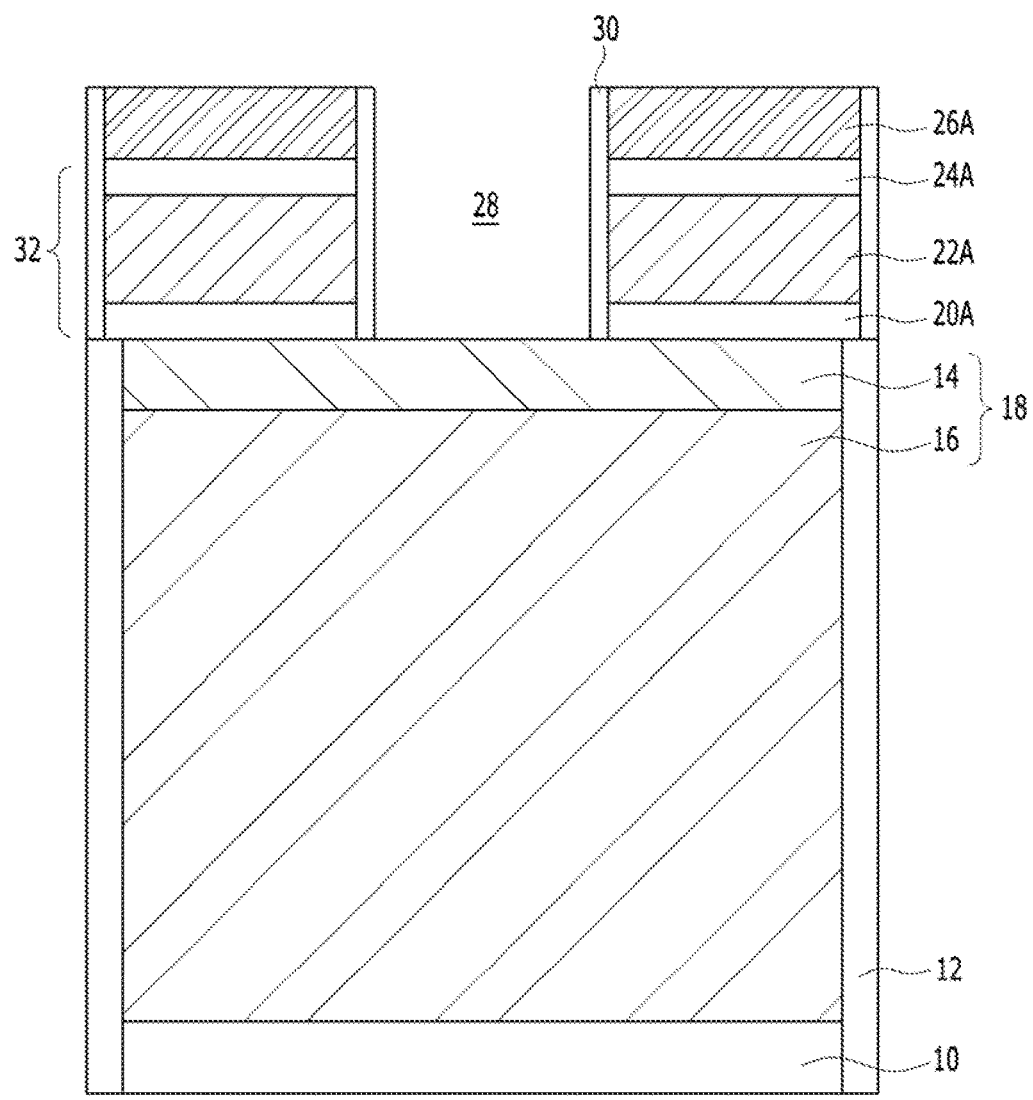

As illustrated in FIG. 5B, a mask pattern (not illustrated) may be formed on the multilayer in which the first dielectric layer 20A, the first conductive layer 22A, the second dielectric layer 24A and the second conductive layer 26A are sequentially stacked. Then, the multilayer may be etched through the mask pattern serving as an etch barrier, to form a pattern including an opening 28 for exposing the photoelectric conversion element 18. The etching process for forming the opening 28 may include a dry etching process. The opening 28 may have a pillar structure of which the plane shape is a polygonal, circular or elliptical shape. The polygonal shape may have a number of sides which is equal to or greater than that of a triangle.

The pattern including the opening 28 may have a structure in which a bottom dielectric layer 20, a first gate electrode 22, a top dielectric layer 24 and a floating diffusion layer 26 are sequentially stacked.

Then, a sidewall dielectric layer 30 may be formed on the sidewalls of the pattern including the sidewalls of the opening 28. The sidewall dielectric layer 30 may be formed through a series of processes of forming a dielectric layer along the surface of the resultant structure including the pattern and performing a blanket etch process, for example, an etch-back process.

Then, a first transfer gate 32 may be formed, which includes the first gate electrode 22, the bottom dielectric layer 20, the top dielectric layer 24 and the sidewall dielectric layer 30. The bottom dielectric layer 20, the top dielectric layer 24 and the sidewall dielectric layer 30 may seal the first gate electrode 22.

Figure 5C:
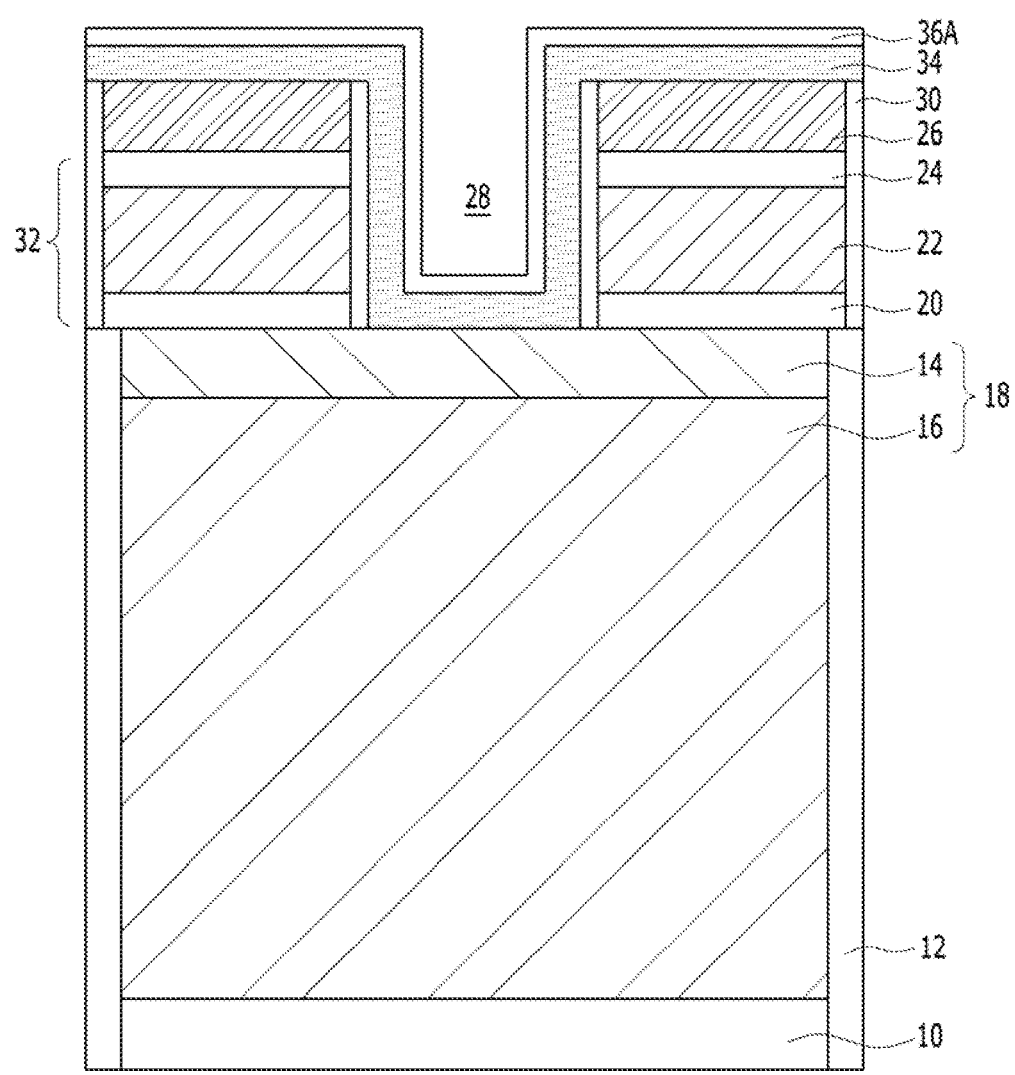

As illustrated in FIG. 5C, a channel layer 34 may be formed along the surface of the resultant structure including the opening 28. The channel layer 34 may have a constant thickness along the surface of the resultant structure. The channel layer 34 may contact the photoelectric conversion element 18 and the floating diffusion layer 26. The channel layer 34 may include a silicon containing material. The silicon containing material may include polysilicon. Specifically, the channel layer 34 may include any one selected from the group consisting of undoped polysilicon, P-type polysilicon and N-type polysilicon.

Then, a third dielectric layer 36A may be formed over the channel layer 34. The third dielectric layer 36A may be formed on the channel layer 34 to have a constant thickness along the surface of the resultant structure including the opening 28. The third dielectric layer 36A may include at least one compound selected from the group consisting of oxide, nitride and oxynitride.

Figure 5D:
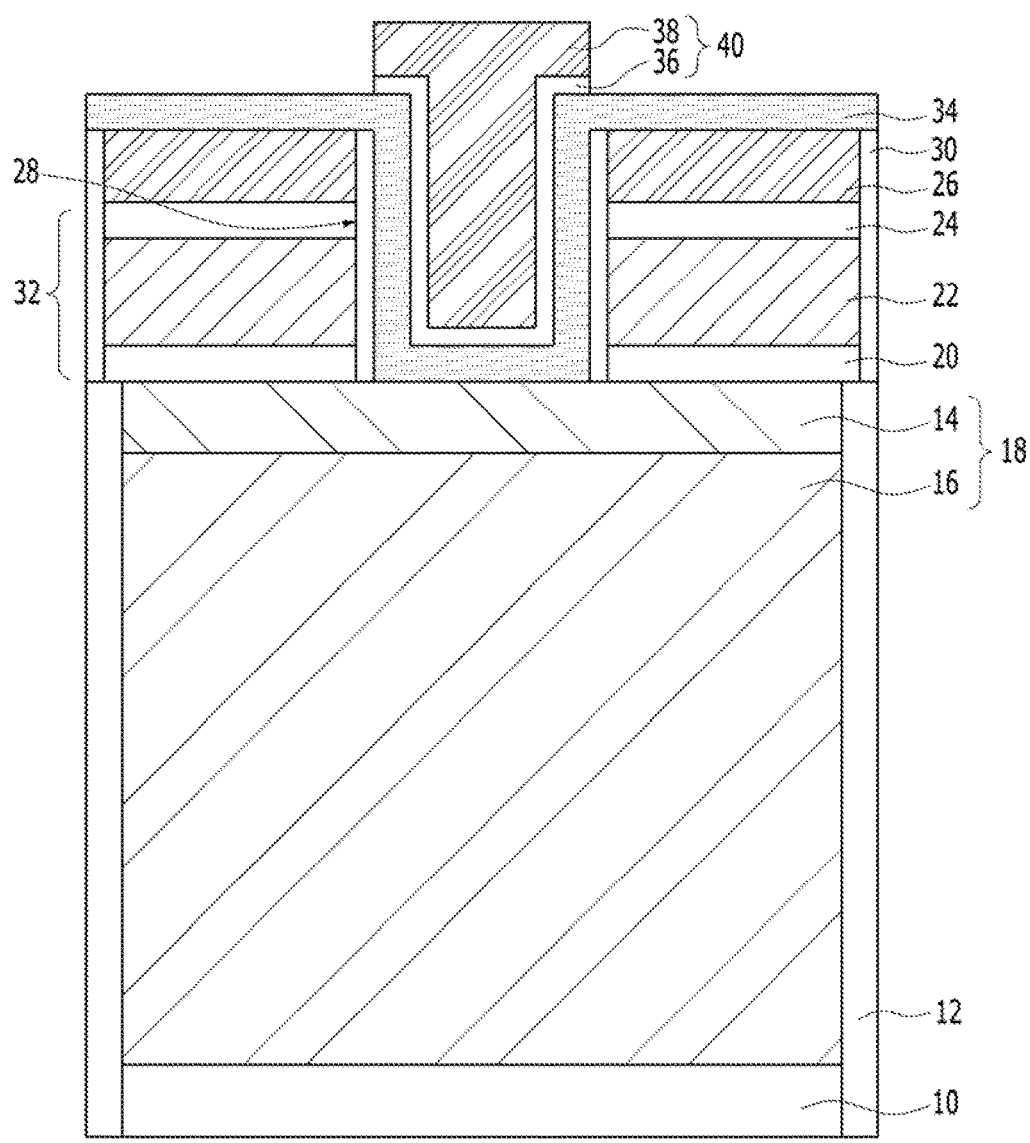

As illustrated in FIG. 5D, a second transfer gate 40 may be formed on the channel layer 34 to gap-fill at least partially the opening 28. The second transfer gate 40 may include a second gate dielectric layer 36 and a second gate electrode 38 formed on the second gate dielectric layer 36. The second transfer gate 40 may be formed through a series of processes of forming a gate conductive layer on the third dielectric layer 36A, the gate conductive layer gap-filling the opening 28 and covering the entire surface of the resultant structure, and then selectively etching the gate conductive layer and the third dielectric layer 36A.

In the present embodiment, when the second transfer gate 40 is formed, the third dielectric layer 36A may be etched to expose the channel layer 34. However, the third dielectric layer 36A may remain on the channel layer 34. The third dielectric layer 36A remaining on the channel layer 34 may serve to protect the channel layer 34 during a subsequent process.

Figure 5E:
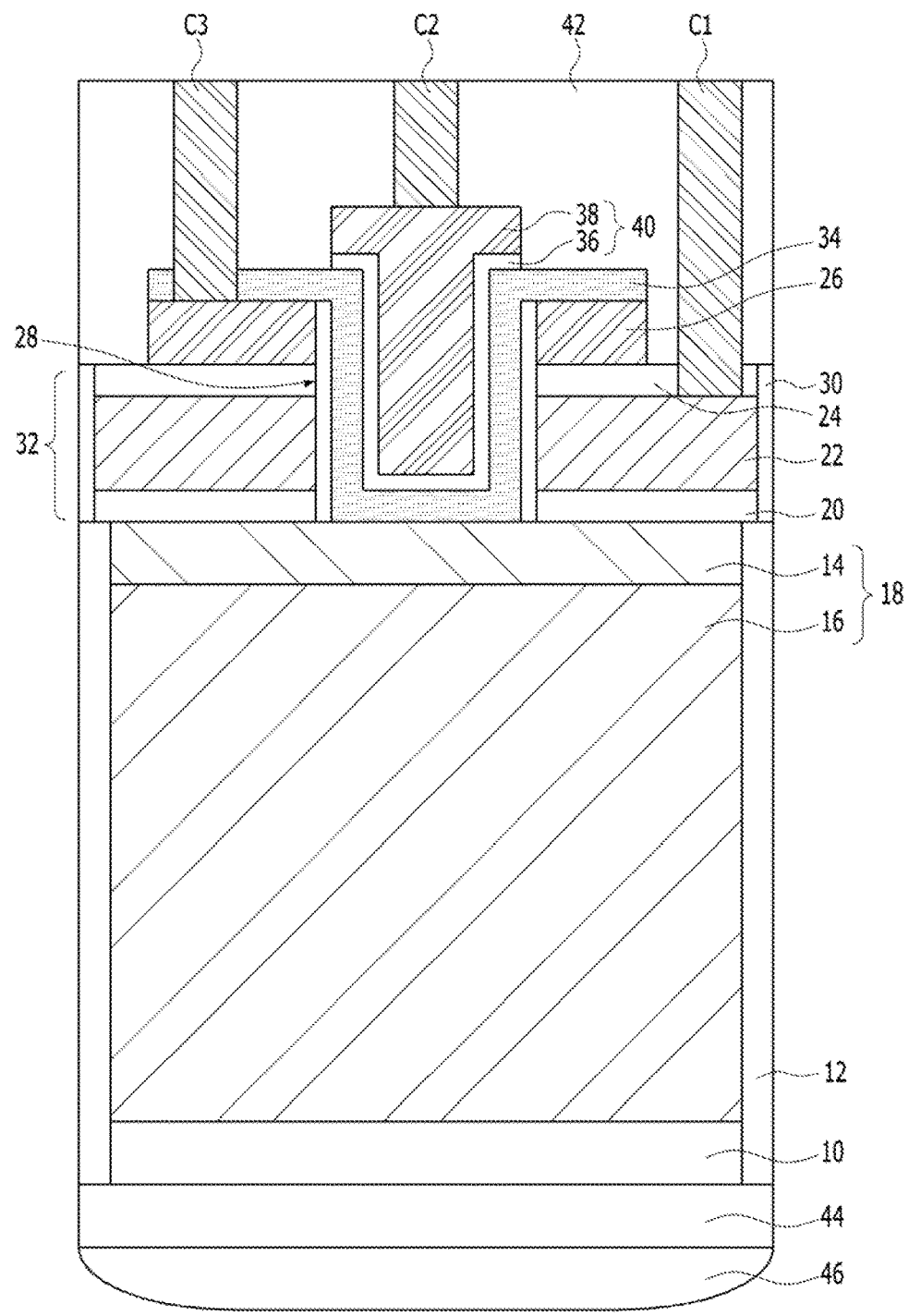

As illustrated in FIG. 5E, a mask pattern (not illustrated) may be formed on the resultant structure including the second transfer gate 40, and the channel layer 34 and the floating diffusion layer 26 may be etched through the mask pattern serving as an etch barrier. This provides a space in which a first contact C1 connected to the first transfer gate 32 is formed, while isolating the channel layer 34 and the floating diffusion layer 26 from another channel layer 34 and another floating diffusion layer 26 which are adjacent thereto.

Then, an interlayer dielectric layer 42 may be formed on the entire surface of the resultant structure. The interlayer dielectric layer 42 may include at least one compound selected from the group consisting of oxide, nitride and oxynitride.

Furthermore, a first contact C1, a second contact C2 and a third contact C3 may be formed to connect to the first transfer gate 32, the second transfer gate 40 and the floating diffusion layer 26, respectively, through the interlayer dielectric layer 42.

Then, a color separation element 44 and a light focusing element 46 may be sequentially formed on the incident surface of the substrate 10.

The image sensor can then be completed through a publicly known fabrication method.

Figure 6:
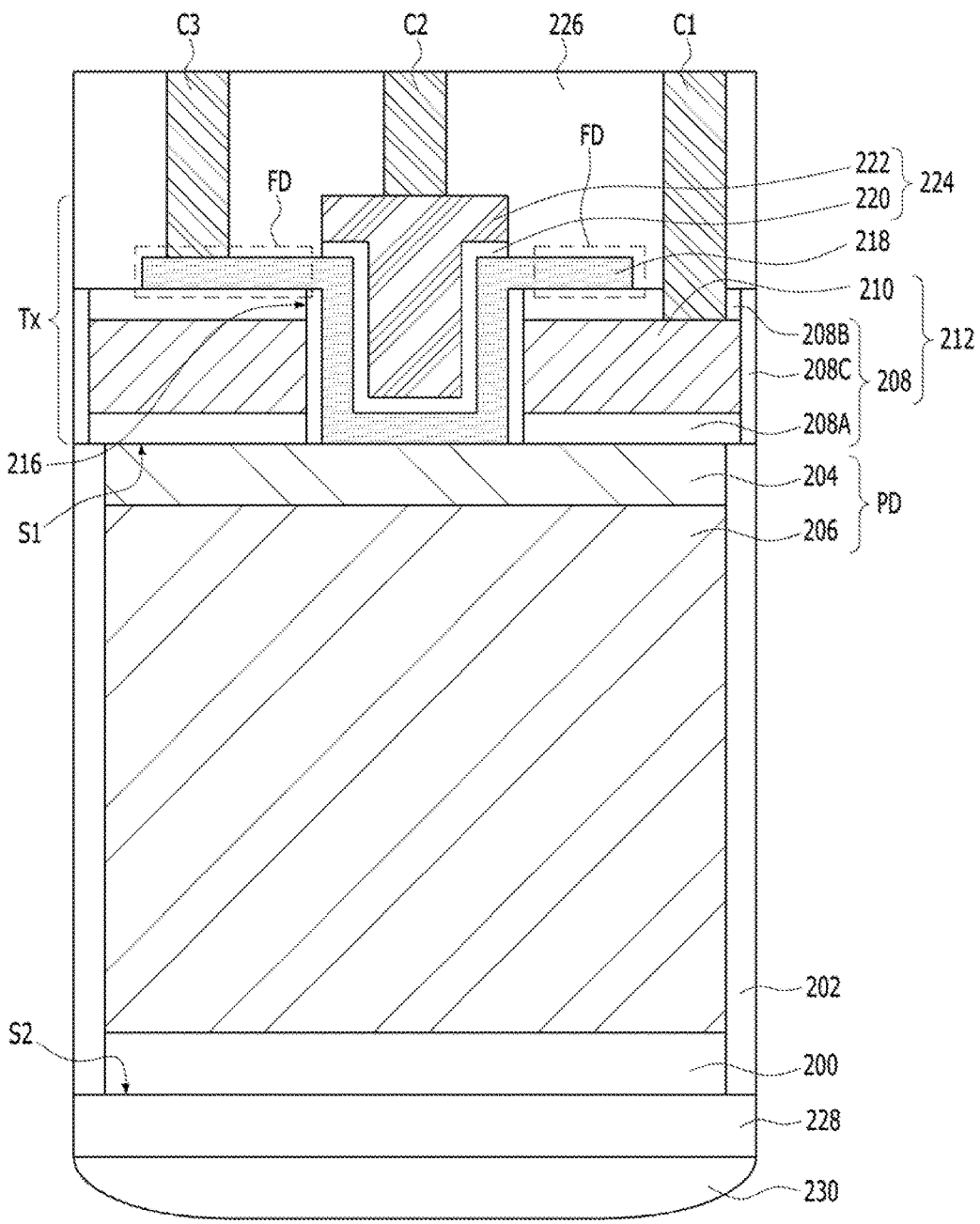
FIG. 6 is a plane view illustrating a unit pixel of an image sensor in accordance with another embodiment.

FIG. 6 is a plane view illustrating a unit pixel of an image sensor in accordance with another embodiment of the present invention. For convenience of description, like reference numerals will represent the same components as those of FIGS. 2 and 3.

The unit pixel in accordance with the embodiment of FIG. 6 has a similar shape to the unit pixel of FIGS. 2 and 3, but is different from the unit pixel of FIGS. 2 and 3 in that the unit pixel does not include a separate floating diffusion layer. In accordance with the embodiment of FIG. 6, the height of the unit pixel can be reduced, and the fabrication process can be simplified.

Specifically, the unit pixel in accordance with the embodiment of FIG. 6 does not include a separate floating diffusion layer. A part of the channel layer 218 which is formed over the first transfer gate 212 and vertically overlaps the first transfer gate 212 may serve as a floating diffusion FD. The channel layer 218 which vertically overlaps the first transfer gate 212 may serve as a floating diffusion FD. Accordingly, since the top dielectric layer 208B has a larger thickness than the sidewall dielectric layer 208C, it is possible to prevent the reduction in characteristics of the channel layer 218 serving as a floating diffusion FD, for example, capacitance due to a bias applied to the first transfer gate 212 during operation of the transfer transistor Tx.

The image sensor in accordance with an embodiment of the present invention may be used in various electronic devices or systems. Hereafter, a camera including an image sensor in accordance with an embodiment of the present invention will be described with reference to FIG. 7.

Figure 7:
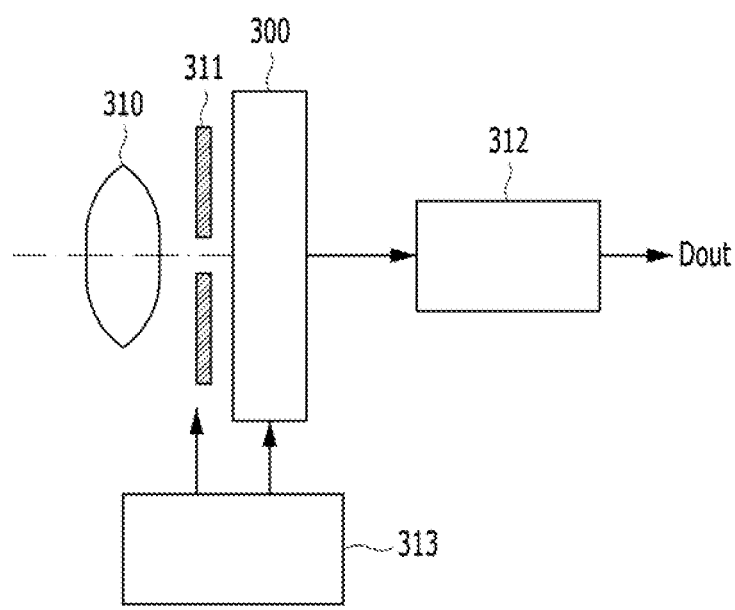
FIG. 7 is a diagram schematically illustrating an electronic device including the image sensor shown in FIG. 1.

FIG. 7 is a diagram schematically illustrating an electronic device including an image sensor shown in FIG. 1. Referring to FIG. 7, the electronic device including the image sensor in accordance with an embodiment of the present invention may be a camera capable of taking a still image or moving image. The electronic device may include an optical system or optical lens 310, a shutter unit 311, a driving unit 313 for controlling/driving the image sensor 300 and the shutter unit 311, and a signal processing unit 312.

The optical system 310 may guide image light from an object to a pixel array of the image sensor 300. The optical system 310 may include a plurality of optical lenses. The shutter unit 311 may control the light irradiation period and the light shield period for the image sensor 300. The driving unit 313 may control a transmission operation of the image sensor 300 and a shutter operation of the shutter unit 311. The signal processing unit 312 may process signals outputted from the image sensor 300 in various manners. The processed image signals Dout may be stored in a storage medium such as a memory or outputted to a monitor or the like.

In accordance with the present embodiments, an image sensor is provided having a higher integration degree without negatively affecting the sensor image characteristics.

Furthermore, it is possible to improve a dark current characteristic.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
   a photoelectric conversion element suitable for generating a photo charge in response to incident light; and
   a transfer transistor suitable for transferring the photo charge generated by the photoelectric conversion element to a floating diffusion in response to a transfer signal,
   the transfer transistor comprising
   a first transfer gate formed over the photoelectric conversion element;
   an opening formed in the first transfer gate and exposing the photoelectric conversion element;
   a second transfer gate formed in the opening; and
   a channel layer interposed between the first and second transfer gates and between the photoelectric conversion element and the second transfer gate,
   wherein the channel layer is formed to have a continuous shape.

2. The image sensor of claim 1, wherein the transfer transistor further comprises a floating diffusion layer formed over the first transfer gate.

3. The image sensor of claim 2, wherein the opening exposes the photoelectric conversion element through the first transfer gate and the floating diffusion layer.

4. The image sensor of claim 2, wherein the channel layer is formed along the resultant structure including the opening to contact the floating diffusion layer and the photoelectric conversion element.

5. The image sensor of claim 2, wherein the floating diffusion layer has a smaller area than the first transfer gate.

6. The image sensor of claim 1, wherein a transfer gate including the first and second transfer gates overlaps the photoelectric conversion element in a vertical direction, and has a larger area than the photoelectric conversion element.

7. The image sensor of claim 1, wherein the first transfer gate comprises a first gate electrode and a first gate dielectric layer surrounding the first gate electrode.

8. The image sensor of claim 7, wherein the first gate dielectric layer comprises:
   a top dielectric layer formed on the top surface of the first gate electrode;
   a bottom dielectric layer formed between the bottom surface of the first gate electrode and the photoelectric conversion element; and
   a sidewall dielectric layer formed on the sidewalls of the first gate electrode including the sidewalls of the opening.

9. The image sensor of claim 8, wherein the top dielectric layer, the bottom dielectric layer and the sidewall dielectric layer have the same thickness, or the sidewall dielectric layer has a smaller thickness than the top dielectric layer and the bottom dielectric layer.

10. The image sensor of claim 1, wherein the opening is positioned at the center or edge of the first transfer gate.

11. The image sensor of claim 1, wherein the opening has a pillar structure of which the plane shape corresponds to a polygonal, circular or elliptical shape or a part of a polygonal, circular or elliptical shape, the polygonal shape having a number of sides which is equal to or greater than that of a triangle.

12. The image sensor of claim 1, wherein the channel layer interposed between the first and second transfer gates has a plane shape including a ring shape with a polygonal, circular or elliptical shape, a straight line shape, a line shape with one or more vertexes or a line shape with a curvature, the polygonal shape having a number of sides which is equal to or greater than that of a triangle.

13. The image sensor of claim 1, wherein one end of the channel layer is expanded to the bottom surface of the opening to contact the photoelectric conversion element, and the other end of the channel layer is expanded to the top of the first transfer gate, and wherein the channel layer expanded to the top of the first transfer gate serves as a floating diffusion.

14. The image sensor of claim 1, wherein the channel layer comprises undoped polysilicon or P-type polysilicon.

15. The image sensor of claim 14, wherein while the transfer transistor is turned off, a negative voltage is applied to the first and second transfer gates.

16. The image sensor of claim 1, wherein the channel layer comprises N-type polysilicon.

17. A method for fabricating an image sensor, comprising:
forming a multilayer over a substrate including a photoelectric conversion element, the multilayer having a structure in which a first dielectric layer, a first conductive layer and a second dielectric layer are sequentially stacked;
selectively etching the multilayer to form an opening which exposes the photoelectric conversion element, and forming a pattern over the photoelectric conversion element, the pattern having a structure in which a bottom dielectric layer, a first gate electrode and a top dielectric layer are sequentially stacked;
forming a first transfer gate over the photoelectric conversion element by forming a sidewall dielectric layer on the sidewalls of the pattern including the sidewalls of the opening, the first transfer gate including the first gate electrode, the bottom dielectric layer, the top dielectric layer and the sidewall dielectric layer;
forming a channel layer along the surface of the resultant structure including the opening; and
forming a second transfer gate on the channel layer, such that the second transfer gate fills the opening.

18. The method of claim 17, wherein the forming of the multilayer comprises forming a second conductive layer over the second dielectric layer.

19. The method of claim 18, further comprising forming a floating diffusion layer having a smaller area than the first transfer gate by selectively etching the second conductive layer, after the forming of the second transfer gate.

20. The method of claim 18, wherein the channel layer is connected to the floating diffusion layer and the photoelectric conversion element.

21. The method of claim 17, wherein the top dielectric layer, the bottom dielectric layer and the sidewall dielectric layer have the same thickness, or the sidewall dielectric layer has a smaller thickness than the top dielectric layer and the bottom dielectric layer.

22. The method of claim 17, wherein the opening is positioned at the center or edge of the first transfer gate.

23. The method of claim 17, wherein the opening has a pillar structure of which the plane shape corresponds to a polygonal, circular or elliptical shape or a part of a polygonal, circular or elliptical shape, the polygonal shape having a number of sides which is equal to or greater than that of a triangle.

24. The method of claim 17, wherein the channel layer interposed between the first and second transfer gates has a plane shape including a ring shape with a polygonal, circular or elliptical shape, a straight line shape, a line shape with one or more vertexes or a line shape with a curvature, the polygonal shape having a number of sides which is equal to or greater than that of a triangle.

* * * * *